United States Patent
Khojasteh et al.

(10) Patent No.: US 7,129,016 B2
(45) Date of Patent: Oct. 31, 2006

(54) POSITIVE RESIST CONTAINING NAPHTHOL FUNCTIONALITY

(75) Inventors: Mahmoud Khojasteh, Poughkeepsie, NY (US); Kuang-Jung Chen, Poughkeepsie, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 10/987,540

(22) Filed: Nov. 12, 2004

(65) Prior Publication Data

US 2006/0105267 A1     May 18, 2006

(51) Int. Cl.
*G03F 7/039* (2006.01)
*G03F 7/30* (2006.01)

(52) U.S. Cl. .................................. 430/270.1; 430/326
(58) Field of Classification Search ..................... None
See application file for complete search history.

(56) References Cited

U.S. PATENT DOCUMENTS

| | | | |
|---|---|---|---|
| 4,822,719 A * | 4/1989 | Schneller et al. | 430/270.1 |
| 4,855,017 A | 8/1989 | Douglas | |
| 5,362,663 A | 11/1994 | Bronner et al. | |
| 5,429,710 A | 7/1995 | Akiba et al. | |
| 5,562,801 A | 10/1996 | Nulty | |
| 5,618,751 A | 4/1997 | Golden et al. | |
| 5,744,376 A | 4/1998 | Chan et al. | |
| 5,801,094 A | 9/1998 | Yew et al. | |
| 5,821,469 A | 10/1998 | Shanmugham | |
| 6,303,266 B1 * | 10/2001 | Okino et al. | 430/270.1 |
| 2001/0036590 A1 * | 11/2001 | Adegawa | 430/270.1 |

* cited by examiner

*Primary Examiner*—Cynthia Hamilton
(74) *Attorney, Agent, or Firm*—Steven Capella

(57) ABSTRACT

Acid-catalyzed positive resist compositions which are imageable with 193 nm radiation are obtained using a polymer having acrylate/methacrylate monomeric units comprising a naphthol ester group. The resist may optionally contain polymer having acrylate/methacrylate monomeric units with fluorine-containing functional groups. The resists containing the polymer having acrylate/methacrylate monomeric units comprising a naphthol ester group have an improved process window, including improved etch resistance and reduced swelling compared to conventional fluorine-containing 193 nm resist.

21 Claims, No Drawings

POSITIVE RESIST CONTAINING NAPHTHOL FUNCTIONALITY

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

The ability to produce smaller devices is limited by the ability of lithographic techniques to reliably resolve smaller features and spacings. The nature of optics is such that the ability to obtain finer resolution is limited in part by the wavelength of light (or other radiation) used to create the lithographic pattern. Thus, there has been a continual trend toward use of shorter light wavelengths for lithographic processes. Recently, the lithography using 193 nm imaging radiation has become more widespread for producing small features.

A resist composition must possess desirable optical properties to enable image resolution at a desired radiation wavelength as well as suitable chemical and mechanical properties to enable transfer to the image from the patterned resist to an underlying substrate layer(s). Thus, a patternwise exposed positive resist must be capable of appropriate dissolution response (i.e., selective dissolution of exposed areas) to yield the desired resist structure. Given the extensive experience in the lithographic arts with the use of aqueous alkaline developers, it is important to achieve appropriate dissolution behavior in such commonly used developer solutions. The patterned resist structure (after development) must be sufficiently resistant to enable transfer of the pattern to the underlying layer(s). Typically, pattern transfer is performed by some form of wet chemical etching or ion etching.

Currently, acrylic resists containing fluoroacrylate (methacrylate) monomers have been popular for use in 193 nm lithography. While these resists have met with some success, there is a continued desire for resists having improved performance. Specifically, it is desired to have resists with improved dissolution characteristics and etch resistance compared to the existing fluoroacrylate (methacrylate)-based resists.

SUMMARY OF THE INVENTION

The invention provides acrylate/methacrylate resist compositions which are capable of high resolution lithographic performance using 193 nm imaging radiation. The resist compositions of the invention possess improved etch resistance for pattern transfer and reduced swelling in response to contact with aqueous alkaline developer. The resists of the invention are preferably characterized by the presence of an imaging polymer having an acrylate/methacrylate backbone with a hydroxynaphthalene group pendant from at least one acrylate/methacrylate monomeric unit making up the backbone of the imaging polymer. Such polymers are preferably characterized by the absence of fluorine constituents. The invention also encompasses resists comprising blends of fluoroacrylate(methacrylate)-based polymers with hydroxynaphthalene-containing polymers of the invention.

The invention also provides lithographic methods using the resist compositions of the invention to create resist structures and methods using the resist structures to transfer patterns to an underlying layer(s) or portion of a substrate or subsequently deposited overlying layers (e.g., by lift-off). The lithographic methods of the invention are preferably characterized by the use of 193 nm ultraviolet radiation patternwise exposure.

In one aspect, the invention encompasses a resist composition comprising:
 (a) an acid-sensitive acrylate and/or methacrylate first imaging polymer, and
 (b) a radiation-sensitive acid generator,
 the imaging polymer comprising:
  i) at least some acrylate and/or methacrylate monomeric units having the following structure:

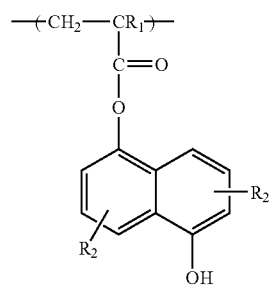

where $R_1$ is hydrogen, methyl, F or $CF_3$ and $R_2$ represents the various hydrogens on the naphthol double ring one or more of which may be substituted with F or $CF_3$.

The imaging polymer preferably further contains:
 ii) acrylate and/or methacrylate monomeric units each having a pendant lactone moiety, and
 iii) acrylate and/or methacrylate monomeric units each having a pendant acid labile moiety that inhibits solubility in aqueous alkaline solutions.

The lactone moiety is preferably present as a pendant lactone ester.

In another aspect, the invention encompasses a method of forming a patterned material structure on a substrate or patterning a portion of a substrate, the method comprising:
 (A) providing a substrate with a layer of the material to be patterned or a substrate with a portion to be patterned,
 (B) applying a resist composition to the substrate to form a resist layer on the substrate, the resist composition of the invention;
 (C) patternwise exposing the substrate to radiation whereby acid is generated by the acid generator in exposed regions of the resist layer by the radiation,
 (D) contacting the substrate with an aqueous alkaline developer solution, whereby the exposed regions of the resist layer are selectively dissolved by the developer solution to reveal a patterned resist structure, and
 (E) transferring resist structure pattern to the material layer, by etching into the material layer and/or the substrate through spaces in the resist structure pattern.

Preferably, the radiation used in step (B) in the above method is 193 nm ultraviolet radiation. The material to be patterned is preferably selected from the group consisting of organic dielectrics, semiconductors, metals, and ceramics. Alternatively, a material layer may be applied over the patterned resist layer, followed by lifting off the patterned resist to reveal a patterned material layer at spaces in the resist pattern.

These and other aspects of the invention are discussed in further detail below.

DETAILED DESCRIPTION OF THE INVENTION

The invention provides acrylate/methacrylate resist compositions which are capable of high resolution lithographic performance using 193 nm imaging radiation. The resist compositions of the invention possess improved etch resistance for pattern transfer and reduced swelling in response to contact with aqueous alkaline developer. The resists of the invention are preferably characterized by the presence of an imaging polymer having an acrylate/methacrylate backbone with a hydroxynaphthalene group pendant from at least one acrylate/methacrylate monomeric unit making up the backbone of the imaging polymer.

The invention also provides lithographic methods using the resist compositions of the invention to create resist structures and methods using the resist structures to transfer patterns to an underlying layer(s) or subsequently deposited overlying layers (e.g., by lift-off). The lithographic methods of the invention are preferably characterized by the use of 193 nm ultraviolet radiation patternwise exposure.

The resist compositions of the invention generally comprise:
(a) an acid-sensitive acrylate and/or methacrylate first imaging polymer, and
(b) a radiation-sensitive acid generator,
where the imaging polymer comprises:
 i) at least some acrylate and/or methacrylate monomeric units having the following structure:

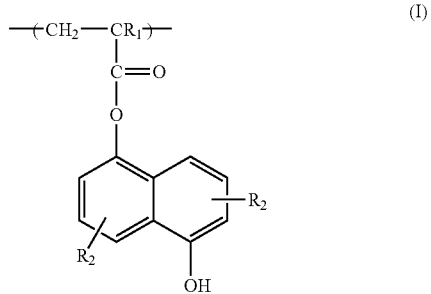

(I)

where $R_1$ is hydrogen, methyl, F or $CF_3$ and $R_2$ represents the various hydrogens on the naphthol double ring one or more of which may be substituted with F or $CF_3$.

The imaging polymer preferably further contains:
ii) acrylate and/or methacrylate monomeric units each having a pendant lactone moiety, and
iii) acrylate and/or methacrylate monomeric units each having a pendant acid labile moiety that inhibits solubility in aqueous alkaline solutions.

Monomeric units i) are preferably methacrylates.

Monomeric units ii) each preferably have a pendant lactone moiety as an ester group. An example of such a methacrylate structure (II) is shown below:

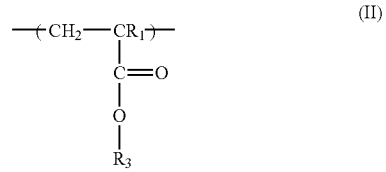

(II)

where $R_1$ is hydrogen, methyl, F or $CF_3$ and $R_3$ is a lactone moiety preferably selected from the group consisting of:

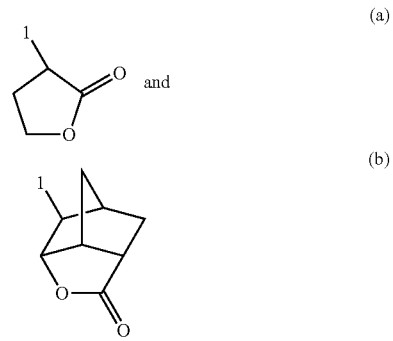

where 1 indicates the location of the bond to an oxygen of the monomeric unit ii). Other lactones may also be used.

The acrylate and/or methacrylate monomeric units iii) have the structure:

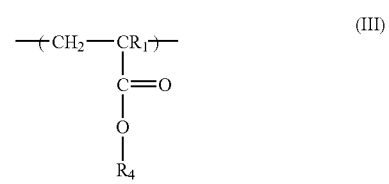

(III)

where $R_1$ is hydrogen, methyl, F or $CF_3$ and $R_4$ is an acid labile group preferably selected from the group consisting of tertiary alkyl, tertiary cycloalkyl, carboxyl esters, ester ketals, and ester acetals. More preferred acid labile groups are selected from the group consisting of methyl cyclopentyl, methyl cyclohexyl, and methyl adamantyl, with methyl adamantyl being most preferred.

For lithographic applications used in the manufacture of integrated circuit structures and other microscopic structures, the imaging polymers of invention preferably comprise at least about 5 mole % of monomeric units i), more preferably about 5–30 mole %, most preferably about 5–15 mole %. The imaging polymers of the invention preferably contain at least about 10 mole % of monomeric units ii), more preferably about 10–55 mole %, most preferably about 15–25 mole %. The imaging polymer preferably contains about 10–50 mole % of monomeric units iii), more preferably about 30–45 mole %. The imaging polymer preferably consists essentially of monomeric units i), ii) and iii). The polymers of the invention preferably contain sufficient monomer i) such that the unexposed polymer itself is substantially insoluble in aqueous alkaline developers commonly used in lithographic applications.

In addition to the acrylate/methacrylate polymers, the resist compositions of the invention contain a radiation-sensitive acid generator (PAG). The invention is not limited to the use of any specific acid generator or combination of acid generators; that is, the benefits of the invention may be achieved using various radiation-sensitive acid generators known in the art. Preferred PAG's are those which contain reduced amounts (or preferably zero) aryl moieties. Where aryl-containing acid generator is employed, the absorptive characteristics of the acid generator at 193 nm may restrict the amount of acid generator that can be included in the formulation. Examples of suitable radiation-sensitive acid generators include (but preferably with alkyl substituted for one or more of any indicated aryl moieties) onium salts such as sulfonium and iodonium sulfonates, more particularly exemplified by triaryl sulfonium hexafluoroantimonate, diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate etc.), substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α-α'bis-sulfonyl diazomethanes, naphthoquinone-4-diazides, alkyl disulfones and others. Preferred acid generators are 4-n-butoxy-1-naphtyltetrahydrothiophenium perfluorooctane sulfonate (BNBS-PFOS), 4-n-butoxy-1-naphtyltetrahydrothiophenium perfluorobutane sulfonate (BNBS-PFBuS) and triphenylsulfonium triflate perfluorobutane sulfonate (TPS-PFBuS).

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate and cyclohexanone.

The compositions of the invention may further contain minor amounts of auxiliary components such as bulky hydrophobic additives, dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines, aromatic amines, or t-alkyl ammonium hydroxides such as t-butyl ammonium hydroxide (TBAH).

The resist compositions of the invention preferably contain about 0.1–20 wt. % (more preferably about 0.5–15 wt. %) radiation-sensitive acid generator based on the total weight of imaging polymer in the composition. Where a solvent is present, the overall composition preferably contains about 50–90 wt. % solvent. The composition preferably contains about 1 wt. % or less of the base additive based on the total weight of imaging polymer.

If desired, the resist may contain a blend of the hydroxynaphthalene-containing polymer and a fluorine-containing imaging polymer such as a fluorocarbinol methacrylate. Examples of some fluorine-containing imaging polymers are described in U.S. Pat. Nos. 6,509,134 and 6,548,219, the disclosures of which are incorporated herein by reference. Where such a blend is used, the blend preferably contains about 5–95 wt. % of the hydroxynaphthalene-containing polymer and 5–95 wt. % of the fluorine-containing polymer based on the total weight of imaging polymer.

The monomers used in the present invention may be synthesized by known techniques. The invention is not limited to any specific method of synthesizing the polymers used in the invention. Preferably, the polymers are formed by free radical polymerization. The polymers of the invention preferably have a weight average molecular weight of about 5,000–50,000, more preferably about 5,000–25,000.

The resist compositions of the invention can be prepared by combining the imaging polymer, acid generator, and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for lithographic processes using 193 nm UV radiation. Where use of other radiation (e.g. mid-UV, 248 nm deep UV, x-ray, or e-beam) is desired, the compositions of the invention can be adjusted (if necessary) by the addition of an appropriate dye or sensitizer to the composition. The general use of the resist compositions of the invention in lithography for semiconductors is described below.

Semiconductor lithographic applications generally involve transfer of a pattern to a layer of material on the semiconductor substrate or into the substrate itself. Alternatively, a material layer may be patterned by a lift-off technique. The material layer of the semiconductor substrate may be a metal conductor layer, a ceramic insulator layer, a semiconductor layer or other material depending on the stage of the manufacture process and the desired material set for the end product. In many instances, an antireflective coating (ARC) is applied over the material layer or substrate to be patterned before application of the resist layer. The ARC layer may be any conventional ARC which is compatible with acid catalyzed resists.

Typically, the solvent-containing resist composition is applied to the desired semiconductor substrate using spin coating or other technique. The substrate with the resist coating is then preferably heated (pre-exposure baked) to remove the solvent and improve the coherence of the resist layer. The thickness of the applied layer is preferably as thin as possible with the provisos that the thickness is preferably substantially uniform and that the resist layer be sufficient to withstand subsequent processing (typically reactive ion etching) to transfer the lithographic pattern to the underlying substrate material layer. The pre-exposure bake step is preferably conducted for about 10 seconds to 15 minutes, more preferably about 15 seconds to one minute. The pre-exposure bake temperature may vary depending on the glass transition temperature of the resist. Preferably, the pre-exposure bake is performed at temperatures which are at least 20° C. below $T_g$.

After solvent removal, the resist layer is then patternwise-exposed to the desired radiation (e.g. 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 5–30 millijoules/cm$^2$).

After the desired patternwise exposure, the resist layer is preferably allowed to stabilize. The resist of the invention does not require the use of post-exposure baking. In some instances, it may be desirable to use post-exposure baking. The post-exposure bake is preferably conducted for about 30 seconds to 5 minutes.

The resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. Preferably, the resist compositions of the invention can be developed with conventional 0.26 N aqueous alkaline solutions. The resist compositions of the invention can also be developed using 0.14 N or 0.21 N or other aqueous alkaline solutions. The resulting resist structure on the substrate is then typically dried to remove any remaining developer solvent. The resist compositions of the invention are generally characterized in that the product resist structures have high etch resistance. In some instances, it may be possible to further enhance the etch resistance of the resist structure by using a post-silylation technique using methods known in the art.

The pattern from the resist structure may then be transferred to the material (e.g., organic dielectric, ceramic, metal or semiconductor) of the underlying substrate or to the underlying substrate itself. Typically, the transfer is achieved by reactive ion etching or some other etching technique. In the context of reactive ion etching, the etch resistance of the resist layer is especially important. Alternatively, a material layer to be patterned may be applied over the patterned resist structure followed by a lift-off step to leave a pattern of material at spaces in the patterned resist structure. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

The processes for making these (organic dielectric, ceramic, metal or semiconductor) features generally involve providing a material layer and/or portion of the substrate to be patterned, applying a layer of resist over the material layer or portion, patternwise exposing the resist to radiation, developing the pattern by contacting the exposed resist with a solvent, etching the layer(s) and/or substrate portion underlying the resist layer at spaces in the pattern whereby a patterned material layer and/or substrate portion is formed, and removing any remaining resist from the substrate. In some instances, a hard mask may be used below the resist layer to facilitate transfer of the pattern to a further underlying material layer and/or portion. Alternatively, a material layer may be applied over the patterned resist layer, followed by lifting off the patterned resist to reveal a patterned material layer on the substrate at spaces in the resist pattern. Examples of such processes are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

SYNTHESIS EXAMPLE 5-hydroxy-1-naphthalenyl methacrylate (a.k.a. hydroxynaphthalene methacrylate or NAMA) monomer (3.04 g, 0.0132 mole), 2-methyl-2-adamantyl methacrylate (a.k.a. methyl adamanyl methacrylate or MAdMA) monomer (14.10 g, 0.0600 mole), 5-methyacryloyloxy-2,6-norbornane carbolactone (a.k.a. norbornane lactone methacrylate or NLM) monomer (13.32 g, 0.0600 mole), azobisisobutyronitrile (AIBN) (1.52 g, 7% of the total mole of all monomers), n-dodecanethiol (n-DDT) (0.53 g, 2% of the total mole of all monomers) and 92 g of MEK methyl ethyl ketone were added to a 250 ml 3-neck round bottom flask equipped with condenser, thermometer, nitrogen inlet and magnetic stirrer bar to form a reaction mixture having 25 wt. % of the monomers. The reaction mixture was stirred at room temperature and bubbled with $N_2$ flow for 45 minutes after which is was heated to 67–70° C. and stirred for 13 hours with a blanket $N_2$ flow. After reaction, the solution was then cooled to room temperature, diluted with 25 g of MEK and added dropwise to 800 g of heptane. The resulting slurry was stirred for two hours before filtration. Solid was air dried on the Buckner filter for 1.5 hours, dissolved in MEK (15% wt-wt) and reprecipitated in 800 g of heptane. The slurry was again stirred for two hours before filtration. The solid was collected and air dried for 2–3 hours before final drying in a vacuum oven at 60° C. overnight. Yield: 92%.

C13-nmr analysis of the polymer indicated a composition of mole ratio 12:40:48 (targeted composition: 10:45:45) of (NAMA:MAdMA:NLM). GPC analysis indicated a molecular weight (Wt Average) of 9000 with polydispersity of 1.79. TGA indicated a wt. loss % of 28.12.

RESIST EXAMPLE 1

A terpolymer of MAdMA, NLM, and NAMA with composition of 45/40/15 mole ratio was dissolved in PGMEA with 4.5 wt % BNBS-PFOS (based on the polymer weight) and 0.17 wt % 1-t-butyloxycarbonyl 2-phenylbenzimidazole (based on the polymer weight) to make a solution of 11% solid content. The resulting solution was filtered through a 0.2 μm filter. The resist was spin coated on an 8-inch silicon wafer which had a 900 Å thick coating of antireflective coating ("AR40" from Rohm & Haas Electronic Materials). The resist was baked at 130° C. for 60 seconds and exposed to ArF (193 nm wavelength) imaging radiation on an ASML scanner (0.75 NA). The exposed wafer was then baked at 130° C. for 90 seconds. The wafer was then developed using a single-spray puddle develop process for 60 seconds with 0.263 N TMAH developer (Moses Lake's AD-10). Under these process conditions, 192 nm lines on a 315 nm pitch were resolved.

RESIST EXAMPLE 2

A terpolymer of (MAdMA/NLM/NAMA) with composition of 49/44/7 mole ratio was dissolved in PGMEA with 4.5 wt % BNBS-PFOS (based on the polymer weight) and 0.17 wt % 1-t-butyloxycarbonyl 2-phenylbenzimidazole (based on the polymer weight) to make a solution of 11% solid content. The resulting solution was filtered through a 0.2 μm filter. The resist was spin coated on a 8-inch silicon wafer which had a 900 Å thick coating of antireflective coating ("AR40" from Rohm & Haas Electronic Materials). The resist was baked at 130° C. for 60 seconds and exposed to ArF (193 nm wavelength) imaging radiation on an ASML scanner (0.75 NA). The exposed wafer was then baked at 130° C. for 90 seconds. The wafer was then developed using a single-spray puddle develop process for 60 seconds with 0.263 N TMAH developer (Moses Lake's AD-10). Under these process conditions, 85 nm lines on a 245 nm pitch were resolved.

RESIST EXAMPLE 3

A terpolymer of (MAdMA/NLM/NAMA) with composition of 45/45/10 mole ratio was dissolved in PGMEA with 4 wt % BNBS-PFBuS (based on the polymer weight) and 0.2 wt % 1-t-butyloxycarbonyl 2-phenylbenzimidazole (based on the polymer weight) to make a solution of 4.9% solid content. The resulting solution was filtered through a 0.2 μm filter. The resist was spin coated on a 12-inch silicon wafer which had a 900 Å thick coating of antireflective coating ("AR40" from Rohm & Haas Electronic Materials). The resist was baked at 120° C. for 60 seconds and exposed to ArF (193 nm wavelength) imaging radiation on an ASML scanner (0.85 NA). The exposed wafer was then baked at 120° C. for 60 seconds. The wafer was then developed using a single-spray puddle develop process for 60 seconds with 0.263 N TMAH developer (Moses Lake's AD-10). Under these process conditions, 75 nm lines on a 150 nm pitch were resolved.

RESIST EXAMPLE 4

A terpolymer of (MAdMA/NLM/NAMA) with composition of 45/50/5 mol % was dissolved in PGMEA with 3 wt % BNBS-PFBuS (based on the polymer weight), 2 wt % TPS-PFBuS (based on the polymer weight) and 0.58 wt % 1-t-butyloxycarbonyl 2-phenylbenzimidazole (based on the polymer weight) to make a solution of 4.9% solid content. The resulting solution was filtered through a 0.2 μm filter. The resist was spin coated on a 12 inch silicon wafer which had a 900 Å thick coating of antireflective coating ("AR40" from Rohm & Haas Electronic Materials). The resist was baked at 120° C. for 60 seconds and exposed to ArF (193 nm wavelength) imaging radiation on an ASML scanner (0.85 NA). The exposed wafer was then baked at 120° C. for 60 seconds. The wafer was then developed using a single-spray puddle develop process for 60 seconds with 0.263 N TMAH developer (Moses Lake's AD-10). Under these process conditions, 70 nm lines on a 140 nm pitch were resolved.

RESIST EXAMPLE 5

A 70 wt % terpolymer (MAdMA/NLM/NAMA) with composition of 49/44/7 mole ratio was blended with 30 wt % second terpolymer of 1-bicyclo[2.2.1]hept-2-yl-1-methylethyl 2-methylacrylate (MANEMA), NLM, and hexafluoroalcohol norbornane methacrylate in a 45/40/10 mole ratio was dissolved in PGMEA with 5 wt % BNBS-PFOS (based on the total polymer weight) and 0.19 wt % 1-t-butyloxycarbonyl 2-phenylbenzimidazole (based on the total polymer weight) to make a solution of 9% solid content. The resulting solution was filtered through a 0.2 μm filter. The resist was spin coated on a 8-inch silicon wafer which had a 900 Å thick coating of antireflective coating ("AR40" from Rohm & Haas Electronic Materials). The resist was baked at 130° C. for 60 seconds and exposed to ArF (193 nm wavelength) imaging radiation on an ASML scanner (0.75 NA). The exposed wafer was then baked at 125° C. for 90 seconds. The wafer was then developed using a single-spray puddle develop process for 60 seconds with 0.263 N TMAH developer (Moses Lake's AD-10). Under these process conditions, 70 nm lines on a 180 nm pitch were resolved.

RESIST EXAMPLE 6

A 70 wt % of terpolymer (MAdMA/NLM/NAMA) with composition of 52/44/4 mole ratio blended with 30% second terpolymer (same as in Resist Example 5) was dissolved in PGMEA with 4.45 wt % BNBS-PFOS (based on the total polymer weight) and 0.15 wt % 1-t-butyloxycarbonyl 2-phenylbenzimidazole (based on the total polymer weight) to make a solution of 9% solid content. The resulting solution was filtered through a 0.2 μm filter. The resist was spin coated on a 8-inch silicon wafer which had a 900 Å thick coating of antireflective coating ("AR40" from Rohm & Haas Electronic Materials). The resist was baked at 130° C. for 60 seconds and exposed to ArF (193 nm wavelength) imaging radiation on an ASML scanner (0.75 NA). The exposed wafer was then baked at 130° C. for 90 seconds. The wafer was then developed using a single-spray puddle develop process for 60 seconds with 0.263 N TMAH developer (Moses Lake's AD-10). Under these process conditions, 70 nm lines on a 200 nm pitch were resolved.

What is claimed is:

1. A resist composition comprising:
   (a) an acid-sensitive acrylate and/or methacrylate first imaging polymer, and
   (b) a radiation-sensitive acid generator, the imaging polymer comprising:
      i) at least some acrylate and/or methacrylate monomeric units having the following structure:

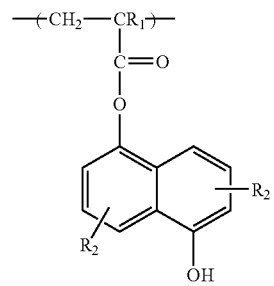

where $R_1$ is hydrogen, methyl, F or $CF_3$, and each $R_2$ is hydrogen, F or $CF_3$ ii) acrylate and/or methacrylate monomeric units each having a pendant lactone moiety, and
   iii) acrylate and/or methacrylate monomeric units each having a pendant acid labile moiety that inhibits solubility in aqueous alkaline solutions.

2. The resist composition of claim 1 wherein said monomeric units ii) have the structure:

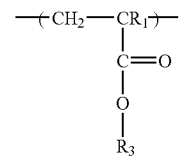

where $R_1$ is hydrogen, methyl, F or $CF_3$, and $R_3$ is a lactone moiety.

3. The resist composition of claim 2 where $R_3$ is selected from the group consisting of:

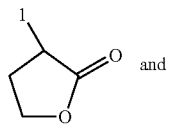

and

-continued (b)

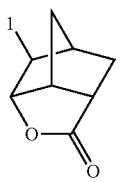

where 1 indicates the location of the bond to an oxygen of monomeric unit ii).

4. The resist composition of claim 2 wherein said monomeric units iii) have the structure:

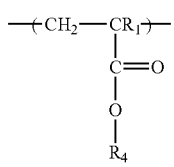

where $R_1$ is hydrogen, methyl, F or $CF_3$, and $R_4$ is an acid labile group selected from the group consisting of tertiary alkyl, tertiary cycloalkyl, carboxyl esters, ester ketals, and ester acetals.

5. The resist composition of claim 4 wherein said monomeric units iii) comprise an acid labile group selected from the group consisting of methyl cyclopentyl, methyl cyclohexyl, and methyl adamantyl.

6. The resist composition of claim 1 wherein said first imaging polymer comprises:

monomeric unit ii) having the structure:

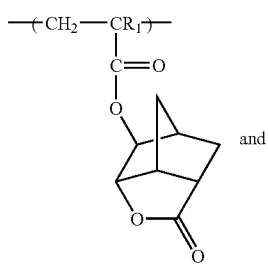

and monomeric unit iii) having the structure:

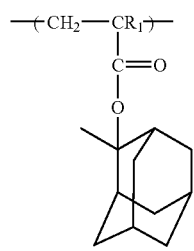

wherein $R_1$ is hydrogen, methyl, F or $CF_3$.

7. The resist composition of claim 1 wherein said first imaging polymer contains about 5–30 mole % of monomeric units i), about 10–55 mole % of monomeric units ii), and about 10–50 mole % of monomeric units iii).

8. The resist composition of claim 1 further comprising a fluorine-containing polymer as a second imaging polymer.

9. The resist composition of claim 1 wherein said composition contains at least about 0.1 wt. % of said radiation-sensitive acid generator based on the weight of said imaging polymer.

10. A method of forming a patterned material structure on a substrate and/or patterning a portion of a substrate, said method comprising:
  (A) providing a substrate with a layer of said material to be patterned and/or a substrate with a portion to be patterned,
  (B) applying a resist composition to said substrate to form a resist layer on said substrate, said resist composition comprising (a) an acid-sensitive acrylate and/or methacrylate first imaging polymer, and (b) a radiation-sensitive acid generator, the first imaging polymer comprising:
    i) at least some acrylate and/or methacrylate monomeric units having the following structure:

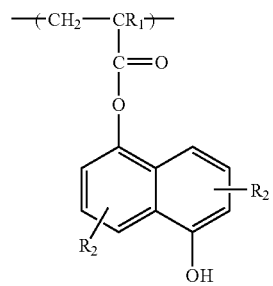

where $R_1$ is hydrogen, methyl, F or $CF_3$, and each $R_2$ is hydrogen, F or $CF_3$,
    ii) acrylate and/or methacrylate monomeric units each having a pendant lactone moiety, and
    iii) acrylate and/or methacrylate monomeric units each having a pendant acid labile moiety that inhibits solubility in aqueous alkaline solutions,
  (C) patternwise exposing said substrate to radiation whereby acid is generated by said radiation-sensitive acid generator in exposed regions of said resist layer by said radiation,
  (D) contacting said substrate with an aqueous alkaline developer solution, whereby said exposed regions of said resist layer are selectively dissolved by said developer solution to reveal a patterned resist structure, and
  (E) transferring resist structure pattern to said material layer and/or into said substrate, by etching into said material layer and/or said substrate through spaces in said resist structure pattern.

11. The method of claim 10 wherein said material is selected from the group consisting of organic dielectrics, metals, ceramics, and semiconductors.

12. The method of claim 10 wherein said monomeric units ii) have the structure:

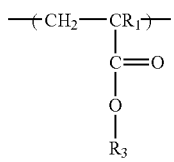

where R₁ is hydrogen, methyl, F or CF₃, and R₃ is a lactone moiety.

13. The method of claim 12 where R₃ is selected from the group consisting of:

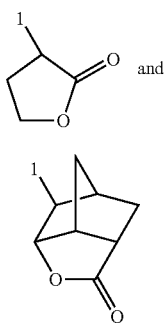

where 1 indicates the location of the bond to an oxygen of monomeric unit ii).

14. The method of claim 10 wherein said monomeric units iii) have the structure:

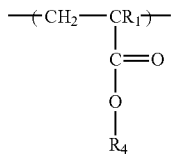

where R₁ is hydrogen, methyl, F or CF₃, and R₄ is an acid labile group selected from the group consisting of tertiary alkyl, tertiary cycloalkyl, carboxyl esters, ester ketals, and ester acetals.

15. The method of claim 14 wherein said monomeric units iii) comprise an acid labile group selected from the group consisting of methyl cyclopentyl, methyl cyclohexyl, and methyl adamantyl.

16. The method of claim 10 wherein said first imaging polymer contains about 5–30 mole % of monomeric units i), about 10–55 mole % of monomeric units ii), and about 10–50 mole % of monomeric units iii).

17. The method of claim 10 wherein said resist composition further comprise a fluorine-containing polymer as a second imaging polymer.

18. The method of claim 10 wherein said etching comprises reactive ion etching.

19. The method of claim 10 wherein at least one intermediate layer is provided between said material layer and said resist layer, and step (E) comprises etching through said intermediate layer.

20. The method of claim 10 wherein said radiation has a wavelength of about 193 nm.

21. A method of forming a patterned material structure on a substrate, said method comprising:

(A) providing a substrate, (B) applying a resist composition to said substrate to form a resist layer on said substrate, said resist composition comprising (a) an acid-sensitive acrylate and/or methacrylate first imaging polymer, and (b) a radiation-sensitive acid generator, the first imaging polymer comprising:

i) at least some acrylate and/or methacrylate monomeric units having the following structure:

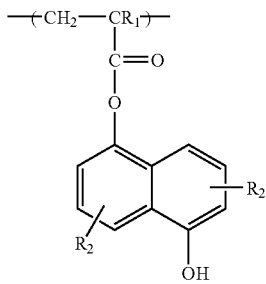

where R₁ is hydrogen, methyl, F or CF₃, and each R₂ is hydrogen, F or CF₃, (C) patternwise exposing said substrate to radiation whereby acid is generated by said radiation-sensitive acid generator in exposed regions of said resist layer by said radiation, (D) contacting said substrate with an aqueous alkaline developer solution, whereby said exposed regions of said resist layer are selectively dissolved by said developer solution to reveal a patterned resist structure, (E) applying a material layer over said patterned resist structure on said substrate whereby said material layer contacts said substrate at spaces in said patterned resist structure, and (F) transferring a pattern to said material layer on said substrate by removing said patterned resist and portions of said material layer lying on said resist structure while leaving said material layer on said substrate at said spaces.

* * * * *